United States Patent
Strassburg et al.

(10) Patent No.: US 6,893,950 B2
(45) Date of Patent: *May 17, 2005

(54) CONTACT STRUCTURE FOR AN ELECTRICALLY OPERATED II/VI SEMICONDUCTOR ELEMENT AND PROCESS FOR THE PRODUCTION THEREOF

(75) Inventors: Matthias Strassburg, Berlin (DE); Oliver Schulz, Berlin (DE); Udo W. Pohl, Berlin (DE); Dieter Bimberg, Berlin (DE)

(73) Assignee: Technische Universitaet Berlin, Berlin (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/721,065

(22) Filed: Nov. 24, 2003

(65) Prior Publication Data

US 2004/0219697 A1 Nov. 4, 2004

Related U.S. Application Data

(63) Continuation of application No. 10/111,611, filed as application No. PCT/EP00/11488 on Nov. 17, 2000, now Pat. No. 6,673,641.

(30) Foreign Application Priority Data

Nov. 17, 1999 (DE) .......................... 199 55 280

(51) Int. Cl.[7] .............................................. H01L 21/28
(52) U.S. Cl. ...................... 438/597; 438/603; 257/78
(58) Field of Search ......................... 438/48, 57, 73, 438/584, 602–610, 22–24, 46; 257/78, 79

(56) References Cited

U.S. PATENT DOCUMENTS 4,234,554 A * 11/1980 Rabenau et al. ............ 423/409
4,851,302 A * 7/1989 Nakagawa et al. ......... 428/658
5,068,204 A * 11/1991 Kukimoto et al. ............ 117/93
5,786,269 A * 7/1998 Murakami et al. .......... 438/603

OTHER PUBLICATIONS

Honda et al, "fromation of highly conductive p-type ZnSe using lithium nitride diffusion"Jpn Appl Phys,vol. 35(No. 7) p3878–9(Apr. 1998).*

Kijima et al, Optimized ZnSe:N/ZnTe:N contact strcuture of ZnSebased II–V laser diodes vol. 73(No. 2)p235–7(apr 23 a9998).*

Lim et al "High p-type doping of ZnSe using lithium nitride diffusion" applied Physcls Letters Vo.65(No. 19) p2437–8(Nov. 7, 1994).*

Kato et al, "Significant progress in II–VI blue green laser diod life time" Elecronic Letters vol. 34(No. 3) p282–284(Feb. 5, 1998).*

* cited by examiner

*Primary Examiner*—Savitri Mulpuri
(74) *Attorney, Agent, or Firm*—Rothwell, Figg, Ernst & Manbeck, P.C.

(57) ABSTRACT

A process for the production of contacts for electrically operated II/VI semiconductor structures (for example laser diodes). The contact materials palladium and gold hitherto used in relation to electrically operated II/VI semiconductor lasers are distinguished by a relatively great, not purely ohmic specific contact resistance in relation to the II/VI cover layer. The consequentially necessary higher operating voltages result in the unnecessary generation of heat and thus substantially accelerate degradation of the entire laser structure. That effect causes a limitation in terms of the service life of II/VI semiconductor laser diodes. The invention permits the operation of semiconductor laser diodes with lower operating voltages. The II/VI semiconductor laser diodes produced with our invention are distinguished by a longer service life. That permits inter alia commercial use of semiconductor laser diodes in the blue-green spectral range.

28 Claims, 1 Drawing Sheet

CONTACT STRUCTURE FOR AN ELECTRICALLY OPERATED II/VI SEMICONDUCTOR ELEMENT AND PROCESS FOR THE PRODUCTION THEREOF

This application is a continuation application of U.S. patent application Ser. No. 10/111,661, filed Apr. 24, 2002, now U.S. Pat No. 6,673,641 which is a 371 of PCT/EP00/11488 filed Nov. 17, 2000 which application is hereby incorporated by reference herein.

The invention concerns a contact structure for an electrically operated II/VI semiconductor element, as is known from the works by T. Honda, S. W. Lim, K. Yanashima, K. Inoue, K. Hara, H. Munekata, H. Kukimoto, F. Koyama and K. Iga, Jpn. J. Appl. Phys., 35, 3878 (1996) and S. W. Lim, T. Honda, F. Koyama, K. Iga, K. Inoue, K. Yanashima, H. Munekata and H. Kukimoto, appl. Phys. Lett. 65, 2437 (1994), and a process for the production thereof.

BACKGROUND OF THE ART

Semiconductor elements such as for example semiconductor laser diodes represent an essential basis of modern information and data processing systems and future display systems. While such laser diodes are available for the infrared, red and blue-violet spectral range, it has hitherto not been possible to produce a green semiconductor laser which enjoys an adequate service life. The most promising approach in terms of embodying a green semiconductor laser is based on II/VI semiconductor structures with ZnTe-bearing cover layers, but the service life of those components is still not satisfactory for commercial use (see E. Kato, H. Noguchi, M. Nagai, H. Okuyama, S. Kijima, and A. Ishibashi, Elec. Lett. 34, 282 (1998)).

Hitherto, those II/VI semiconductor laser structures with ZnTe-bearing cover layers were contacted by metals, typically palladium which is deposited on the semiconductor surface. Then platinum and/or gold are deposited on the palladium layer (see M. Haase, J. Qui, J. M. DePuydt, and H. Cheng; Appl. Phys. Lett. 59, 1272 (1991), M. Ozawa, F. Hiei, A. Ishibashi, and K. Akikmoto, Elect. Lett. 29.503 (1993) and S. Kijima, H. Okuyama, Y. Sanaka, T. Kobaayshi, S. Tomiya, and A. Ishibashi; Appl. Phys. Lett. 73; 235 (1998)). The operation of applying those layers is carried out by means of vapor deposition, for example thermal vapor deposition or electron beam vapor deposition. The use of lithium nitride in II/VI semiconductor technology is hitherto only known as a doping material, in which case the material is diffused in at temperatures of between 350° C. and 570° C. (see T. Honda, S. W. Lim, K. Yanashima, K. Inoue, K. Hara, H. Munekata, H. Kukimoto, F. Koyama and K. Iga, Jpn. J. Appl. Phys., 35, 3878 (1996) and S. W. Lim, T. Honda, F. Koyama, K. Iga, K. Inoue, K. Yanashima, H. Munekata and H. Kukimoto, Appl. Phys. Lett. 65, 2437 (1994)). A laser use presupposes a doping concentration of at least $10^{18}$ cm$^{-3}$. That was only approximately attained at a temperature of 470° C., with that process. That temperature however would trigger off diffusion effects (for example of Cd) in the deeper laser layers, so that the consequence would be destruction of the laser structure. Therefore that process cannot be applied in laser technology.

The heat which is generated during electrical operation of the laser diode, for example due to the contact resistance at the contact, contributes substantially to the degradation of the entire structure.

SUMMARY OF THE INVENTION

A reduction in contact resistance is achieved by the present invention. A long service life for the contact structure is also ensured.

The process includes the application of lithium nitride ($Li_3N$) in a layer thickness of typically between 2 nm and 20 nm, to II/VI semiconductor structures, for example with ZnTe-bearing cover layers. That is effected for example by means of thermal vapor deposition, electron beam vapor deposition or vacuum sputtering. In combination with the covering of the lithium nitride layer, by means of cover layers, such as for example palladium and/or gold/platinum, oxidation of the lithium nitride in air is prevented. Typical layer thicknesses for those coverings are between 5 nm and 1 μm. In order to protect the side faces of the lithium nitride layer from oxidation, some embodiments provide that insulating materials (for example silicon nitride) can be applied. The operation of tempering the structure results in a further reduction in the contact resistance. In addition that enhances the durability of the contact. A further possible way of improving the contact properties (for example adhesion of the lithium nitride to the sample surface) is afforded by the use of thin bonding layers (for example metalization layers) between the semiconductor and the lithium nitride.

The contact resistance of II/VI semiconductor structures (for example laser diodes) and thus the thermal stressing thereof can be greatly reduced by the use of that lithium nitride layer. That results in a slower rate of degradation of those components and thus affords longer service lives.

Commercial availability of green semiconductor laser diodes opens up a large number of possible uses such as laser television or an improvement in laser printing.

BRIEF DESCRIPTION OF THE DRAWING

An embodiment of a contact structure according to the invention is shown in FIG. 1.

Abbreviations:
ZnTe: zinc telluride
$Li_3N$: lithium nitride
Cd: cadmium

DETAILED DESCRIPTION OF A PREFERRED EMBODIMENT

Figure 1:
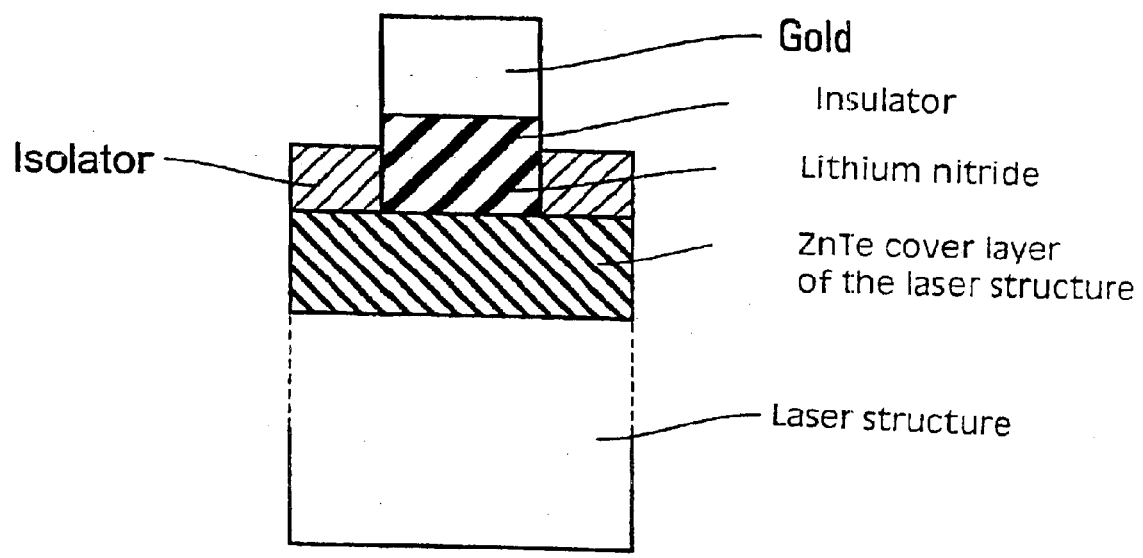

The process includes the application of lithium nitride ($Li_3N$) in a layer thickness of typically between 2 nm and 20 nm, to II/VI semiconductor structures, for example with ZnTe-bearing cover layers. That is effected for example by means of thermal vapor deposition, electron beam vapor deposition or vacuum sputtering. In combination with the covering of the lithium nitride layer, by means of cover layers, such as for example palladium and/or gold/platinum, oxidation of the lithium nitride in air is prevented. Typical layer thicknesses for those coverings are between 5 nm and 1 μm. In order to protect the side faces of the lithium nitride layer from oxidation, some embodiments provide that insulating materials (for example silicon nitride) can be applied. The operation of tempering the structure results in a further reduction in the contact resistance. In addition that enhances the durability of the contact. A further possible way of improving the contact properties (for example adhesion of the lithium nitride to the sample surface) is afforded by the use of thin bonding layers (for example metalization layers) between the semiconductor and the lithium nitride.

The contact resistance of II/VI semiconductor structures (for example laser diodes) and thus the thermal stressing thereof can be greatly reduced by the use of that lithium nitride layer. That results in a slower rate of degradation of those components and thus affords longer service lives.

Commercial availability of green semiconductor laser diodes opens up a large number of possible uses such as laser television or an improvement in laser printing.

What is claimed is:

1. A contact for electrically operated II/VI semiconductor structures, characterized in that lithium nitride layer is disposed between the semiconductor structure and other contact layers.

2. The contact of claim 1 characterized in that the lithium nitride layer is covered by further contact layers.

3. The contact of claim 2, wherein the lithium nitride layer is protected laterally by insulating layers.

4. A process for forming a contact for an electrically operated II/VI semiconductor structure comprising a semiconductor and at least one further contact layer, the process comprising the step of:

using lithium nitride layer ($Li_3N$) as a contact material between the semiconductor and the further contact layers.

5. The process of claim 4, wherein the lithium nitride layer ($Li_3N$) is applied as a contact material to the sample surface by means of vapor deposition and/or sputtering.

6. The process of claim 5, comprising:

covering the lithium nitride layer by one or more further contact layers.

7. The process of claim 6, comprising:

protecting the lithium nitride layer laterally by insulating layers.

8. The process of claim 7, comprising:

tempering a resultant semiconductor laser structure after the coating operation.

9. The process of claim 4, wherein a bonding layer is used between the semiconductor and the lithium nitride layer.

10. A contact structure for an electrically operated II/VI semiconductor element comprising:

a p-doped semiconductor layer of II/VI semiconductor material which is joined by way of a contact layer to a metal contact, wherein the contact layer comprises lithium nitride layer and is of a thickness of between 2 nm and 20 nm.

11. The contact structure of claim 10 wherein at least one further contact layer is arranged between the contact layer of lithium nitride layer and the metal contact.

12. The contact structure of claim 11, wherein the contact layer of lithium nitride layer is protected laterally by insulating layers.

13. The contact structure of claim 12, wherein a bonding layer is arranged between the semiconductor laser of II/VI semiconductor material and the contact layer of lithium nitride layer.

14. The contact structure of claim 12, wherein the II/VI semiconductor element includes a laser structure.

15. A process for the production of a contact structure as set forth in claim 14, wherein the lithium nitride layer for forming the contact layer of lithium nitride is applied to the semiconductor layer of II/VI semiconductor material by means of vapor deposition and/or sputtering.

16. The process of claim 15, wherein the II/VI semiconductor element is tempered after the coating operation in order further to reduce the contact resistance.

17. The contact of claim 2, wherein the further contact layers protect against oxidation.

18. The contact of claim 1, wherein the lithium nitride layer is protected laterally by insulating layers.

19. The process of claim 4, comprising:

covering the lithium nitride layer by one or more further contact layers.

20. The process of claim 19, comprising:

protecting the lithium nitride layer laterally by insulating layers.

21. The process of claim 4, comprising:

protecting the lithium nitride layer laterally by insulating layers.

22. The process of claim 4, comprising:

tempering a resultant semiconductor laser structure after the coating operation.

23. The process of claim 9, wherein the bonding layer is applied by metalization.

24. The contact structure of claim 10, wherein the contact layer of lithium nitride layer is protected laterally by insulating layers.

25. The contact structure of claim 10, wherein a thin bonding layer is arranged between the semiconductor of II/VI semiconductor material and the contact layer of lithium nitride.

26. The contact structure of claim 11, wherein a bonding layer is arranged between the semiconductor laser of II/VI semiconductor material and the contact layer of lithium nitride.

27. The contact structure of claim 10, wherein the II/VI semiconductor element includes a laser structure.

28. The contact structure of claim 11, wherein the II/VI semiconductor element includes a laser structure.

* * * * *